(12) United States Patent
Zhou

(10) Patent No.: US 12,737,061 B2
(45) Date of Patent: Sep. 15, 2026

(54) EASILY DETACHABLE MOUSE BATTERY AND MOUSE

(71) Applicant: Shenzhen New Leading Electronics Co., Ltd., Shenzhen (CN)

(72) Inventor: Ting Zhou, Shenzhen (CN)

(73) Assignee: Shenzhen New Leading Electronics Co., Ltd., Shenzhen (CN)

( * ) Notice: Subject to any disclaimer, the term of this patent is extended or adjusted under 35 U.S.C. 154(b) by 0 days.

(21) Appl. No.: 19/557,124

(22) Filed: Mar. 5, 2026

(65) Prior Publication Data

US 2026/0194999 A1 Jul. 9, 2026

(51) Int. Cl.

| | |
|---|---|
| ***G06F 3/03*** | (2006.01) |
| ***G06F 3/0354*** | (2013.01) |
| ***G06F 3/039*** | (2013.01) |
| ***H01M 50/102*** | (2021.01) |
| ***H01M 50/242*** | (2021.01) |
| ***H01M 50/244*** | (2021.01) |
| ***H01M 50/247*** | (2021.01) |
| ***H01M 50/271*** | (2021.01) |
| *H05K 5/03* | (2006.01) |

(52) U.S. Cl.

CPC .......... *G06F 3/039* (2013.01); *G06F 3/03543* (2013.01); *H01M 50/102* (2021.01); *H01M 50/242* (2021.01); *H01M 50/244* (2021.01); *H01M 50/247* (2021.01); *H01M 50/271* (2021.01); *H01M 2220/30* (2013.01); *H05K 5/03* (2013.01)

(58) Field of Classification Search

CPC .... G06F 3/0354; G06F 3/039; G06F 3/03543; H01M 10/46; H01M 50/247; H01M 50/242; H01M 50/102; H01M 50/244; H01M 50/271; H02J 7/00; H05K 5/03

See application file for complete search history.

(56) References Cited

U.S. PATENT DOCUMENTS

| | | | | |
|---|---|---|---|---|
| 10,248,225 | B1 * | 4/2019 | Tseng | G06F 3/0202 |
| 2009/0225029 | A1 * | 9/2009 | Wu | G06F 3/03543 345/163 |
| 2014/0354548 | A1 * | 12/2014 | Lee | G06F 3/0321 345/166 |
| 2019/0002735 | A1 * | 1/2019 | Gupta | C09J 7/10 |
| 2024/0085994 | A1 * | 3/2024 | Rigaldies | G06F 3/03548 |
| 2025/0093975 | A1 * | 3/2025 | Gu | G06F 3/03543 |

* cited by examiner

*Primary Examiner* — Michael A Faragalla
(74) *Attorney, Agent, or Firm* — Birchwood IP

(57) ABSTRACT

A battery pack of the present disclosure achieves sequential snap-fit engagement through a longer first positioning block at one end and a second positioning block at the other end matching with a first positioning hole and a second positioning hole in a battery compartment, and is combined with the elastic abutting force of an elastic arm to ensure stable mounting and easy disassembly; guide ribs on two opposite side walls of the battery compartment form an auxiliary support after the battery pack is mounted in place, effectively restricting the left and right swinging of the battery pack, and converting surface contact into line contact to reduce frictional resistance; a battery pack disassembly opening and an outer cover disassembly opening are matched with a first protrusion and a second protrusion, so that a user can open an outer cover of the battery compartment and pull up the battery pack without any tools.

3 Claims, 15 Drawing Sheets

EASILY DETACHABLE MOUSE BATTERY AND MOUSE

TECHNICAL FIELD

The present disclosure relates to the field of battery technology, and more particularly, to an easily detachable mouse battery and a mouse incorporating the same.

BACKGROUND

Wireless mice are typically powered by built-in batteries and equipped with wireless receivers for signal transmission. Conventional mouse batteries are generally mounted in a battery compartment at the bottom of the mouse and secured by a battery cover; wireless receivers are either housed in a separate storage slot or directly inserted into the mouse. However, existing battery mounting structures mostly adopt simple snap-fit or interference fit designs, which render battery disassembly and assembly cumbersome. Moreover, prolonged use tends to cause poor contact due to shaking, compromising the reliability of electrical connections.

Accordingly, the present disclosure provides an easily detachable mouse battery and a mouse to address the aforementioned drawbacks.

SUMMARY

(1) Technical Problem Solved

In view of the deficiencies of the prior art, the present disclosure provides an easily detachable mouse battery and a mouse, which solves the problems of the conventional mouse battery mounting structure, including inconvenient disassembly and assembly, unstable fixation, loose layout of the receiver and battery compartment, low space utilization, and poor user-friendliness in operation as mentioned in the background art.

(2) Technical Solution

To achieve the above objective, the present disclosure specifically adopts the following technical scheme:

An easily detachable mouse battery, comprising:

- a battery pack, a first positioning block being disposed at one end of the battery pack, and a second positioning block being disposed at the other end of the battery pack;
- a battery compartment, a first positioning hole mated with the first positioning block and a second positioning hole mated with the second positioning block being formed on an inner wall of the battery compartment.

Further, at least one elastic arm is disposed on a side wall of the battery compartment, the elastic arm being located at one side of the first positioning hole and extending toward an inner portion of the battery compartment.

Further, a length of the first positioning block is greater than that of the second positioning block; a first protrusion is disposed at an end of the battery pack corresponding to the second positioning block;

- the first positioning hole and the second positioning hole are respectively formed on two opposite side walls of the battery compartment, guide ribs are further disposed on the two opposite side walls of the battery compartment, and ends of the guide ribs facing an opening of the battery compartment are arcuately configured.

Further, the mouse battery further comprises a battery compartment outer cover groove and a battery compartment outer cover, the battery compartment outer cover groove being formed at the opening of the battery compartment, at least two positioning notches and one clamping hole being formed in the battery compartment outer cover groove, a positioning bump mated with the positioning notches and a buckle mated with the clamping hole being disposed on the battery compartment outer cover;

- a battery pack disassembly opening corresponding to a position of the first protrusion is formed in the battery compartment outer cover groove;
- an outer cover disassembly opening is formed on a side wall of the battery compartment outer cover groove opposite to the clamping hole, and a second protrusion corresponding to the outer cover disassembly opening is disposed on the battery compartment outer cover.

Further, the battery pack comprises a housing and a battery cell disposed in the housing, an outer side of the housing being wrapped with a fixed wrapping sticker for securing the battery cell within the housing, a battery cell protection plate located at one end of the battery cell and a cell support cotton located above the battery cell protection plate being further disposed in the housing, a conductive region being disposed on the battery cell protection plate, a butt joint hole being formed at a bottom of the housing, and the conductive region being exposed through the butt joint hole; a contact copper pin is disposed in the battery compartment, and the contact copper pin extends toward the inner portion of the battery compartment for contacting the conductive region.

Further, the mouse battery further comprises a receiver compartment, the receiver compartment being disposed at one side of the battery compartment, an opening of the receiver compartment extending into the battery compartment outer cover groove, and receiver pick-and-place grooves being formed on two sides of the opening of the receiver compartment.

A mouse, comprising a mouse main body and the aforementioned easily detachable mouse battery, the mouse main body comprising a mouse upper cover and a mouse lower cover connected in a covering manner;

- a key operating mechanism is assembled on the mouse upper cover;
- a main circuit board is mounted on a top of the mouse lower cover, a roller module, a left key switch and a right key switch respectively located on two sides of the roller module being integrated on the main circuit board;
- the battery compartment, the battery compartment outer cover groove and the receiver compartment are all integrally formed at a bottom of the mouse lower cover.

Further, the key operating mechanism comprises a left key pressing member and a right key pressing member, and one ends of the left key pressing member and the right key pressing member are respectively connected with an inner wall of the mouse upper cover;

- a secondary circuit board is fixed in an inner cavity of the mouse upper cover, a DPI adjustment switch, two side key switches and an indicator light being integrated on a top of the secondary circuit board;
- a DPI adjustment button is disposed in the inner cavity of the mouse upper cover, the DPI adjustment button being mounted in the mouse upper cover via a mounting bracket integrally formed therewith, a pressing end of the DPI adjustment button corresponding to the DPI adjustment switch, and an operating end of the DPI adjustment button passing through the mouse upper cover and being exposed between the left key pressing member and the right key pressing member.

Further, a light shield is further disposed in the inner cavity of the mouse upper cover, a bottom of the light shield covering an outer side of the indicator light, a light guide member being connected to a top of the light shield, and one end of the light guide member extending to one side of the DPI adjustment button;

two side key pressing members are disposed at positions in the inner cavity of the mouse upper cover corresponding to the side key switches, and one ends of the side key pressing members extend to an outer side of a side wall of the mouse upper cover.

Further, a top of the roller module passes through the mouse upper cover and is exposed between the left key pressing member and the right key pressing member;

an optical sensing lens, a pairing key and a power switch respectively located on two sides of the optical sensing lens are integrated on a bottom of the main circuit board;

a switch knob corresponding to the power switch and a pairing button corresponding to the pairing key are further disposed on the top of the mouse lower cover, and the switch knob and the pairing button are respectively exposed through through holes formed on the mouse lower cover;

a charging interface is further connected to the bottom of the main circuit board, and one end of the charging interface extends to an outer side of an end portion of the mouse upper cover;

a light-transmitting window for exposing the optical sensing lens is formed at the bottom of the mouse lower cover, a main anti-slip pad located at an outer side of the light-transmitting window is further disposed at the bottom of the mouse lower cover, and the main anti-slip pad is annularly configured;

a plurality of hollowed-out areas are distributed at the bottom of the mouse lower cover, an auxiliary anti-slip pad being embedded in each of the hollowed-out areas; an auxiliary circuit board (69) is further fixed on a top surface of the mouse lower cover, and the contact copper pin is mounted on the auxiliary circuit board.

(3) Advantages

Compared with the prior art, the present disclosure provides an easily detachable mouse battery and a mouse, which have the following advantages:

In the present disclosure, the battery pack achieves sequential snap-fit engagement via the longer first positioning block at one end and the second positioning block at the other end, which mate with the first positioning hole and the second positioning hole in the battery compartment, and the elastic abutting force of the elastic arm is combined to ensure stable mounting and easy disassembly; the guide ribs on the two opposite side walls of the battery compartment form an auxiliary support after the battery pack is mounted in place, effectively restricting left and right swinging of the battery pack, and converting surface contact into line contact to reduce frictional resistance; the battery pack disassembly opening and the outer cover disassembly opening are mated with the first protrusion and the second protrusion, enabling a user to open the outer cover of the battery compartment and pull up the battery pack without any tools; the opening of the receiver compartment extends into the battery compartment outer cover groove, with receiver pick-and-place grooves formed on two sides of the opening for facilitating the pick-and-place of the receiver. The overall structure is compact, which significantly improves the convenience of assembling and disassembling the battery pack and the receiver as well as the stability in use.

DETAILED DESCRIPTION OF EMBODIMENTS

The technical solutions in the embodiments of the present disclosure will be clearly and completely described below with reference to the accompanying drawings in the embodiments of the present disclosure. Obviously, the described embodiments are only a part of the embodiments of the present disclosure, rather than all the embodiments. Based on the embodiments of the present disclosure, all other embodiments obtained by those of ordinary skill in the art without creative efforts shall fall within the protection scope of the present disclosure.

Embodiment 1

Figure 1:
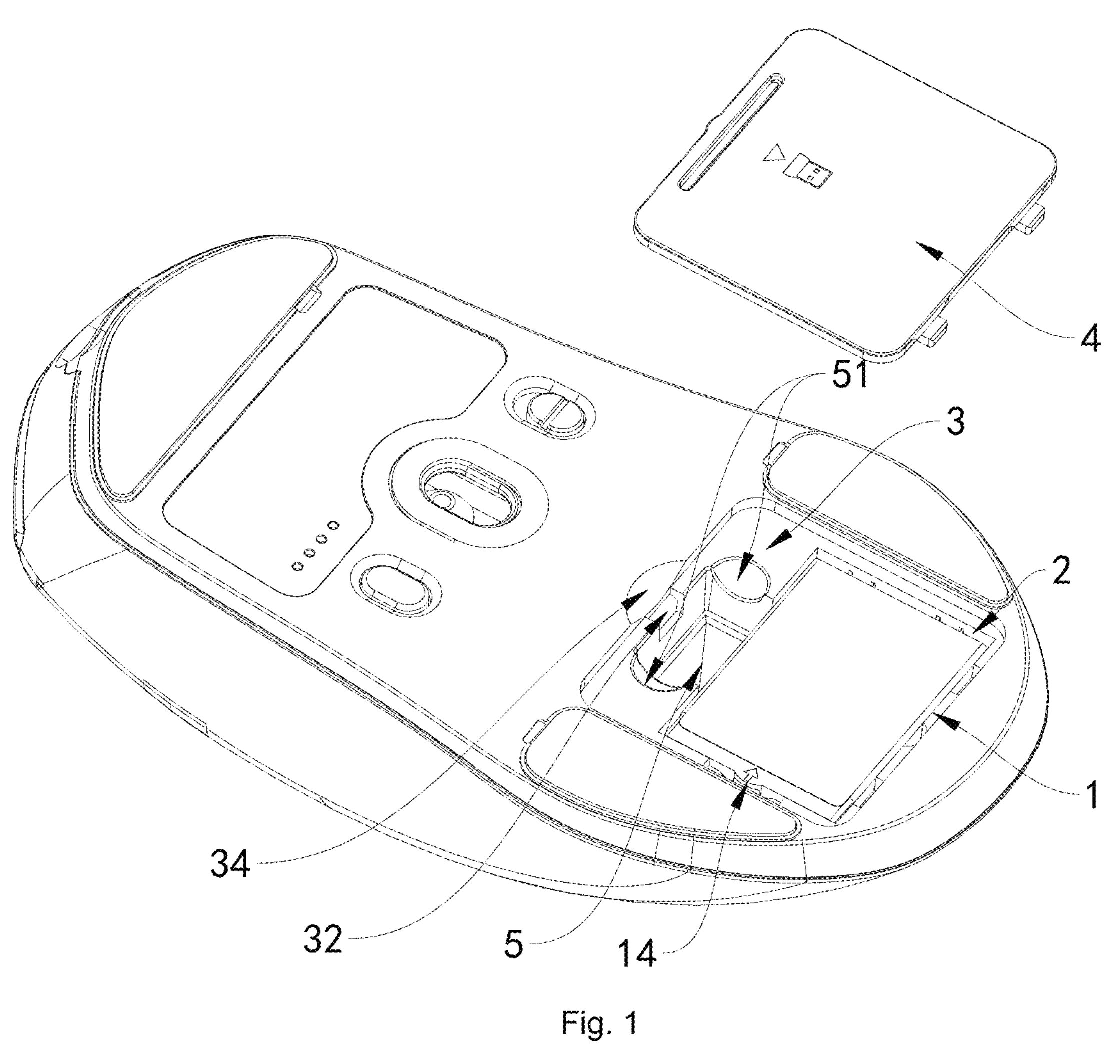
FIG. 1 is a structural schematic view of a battery pack of the present disclosure.
Figure 2:
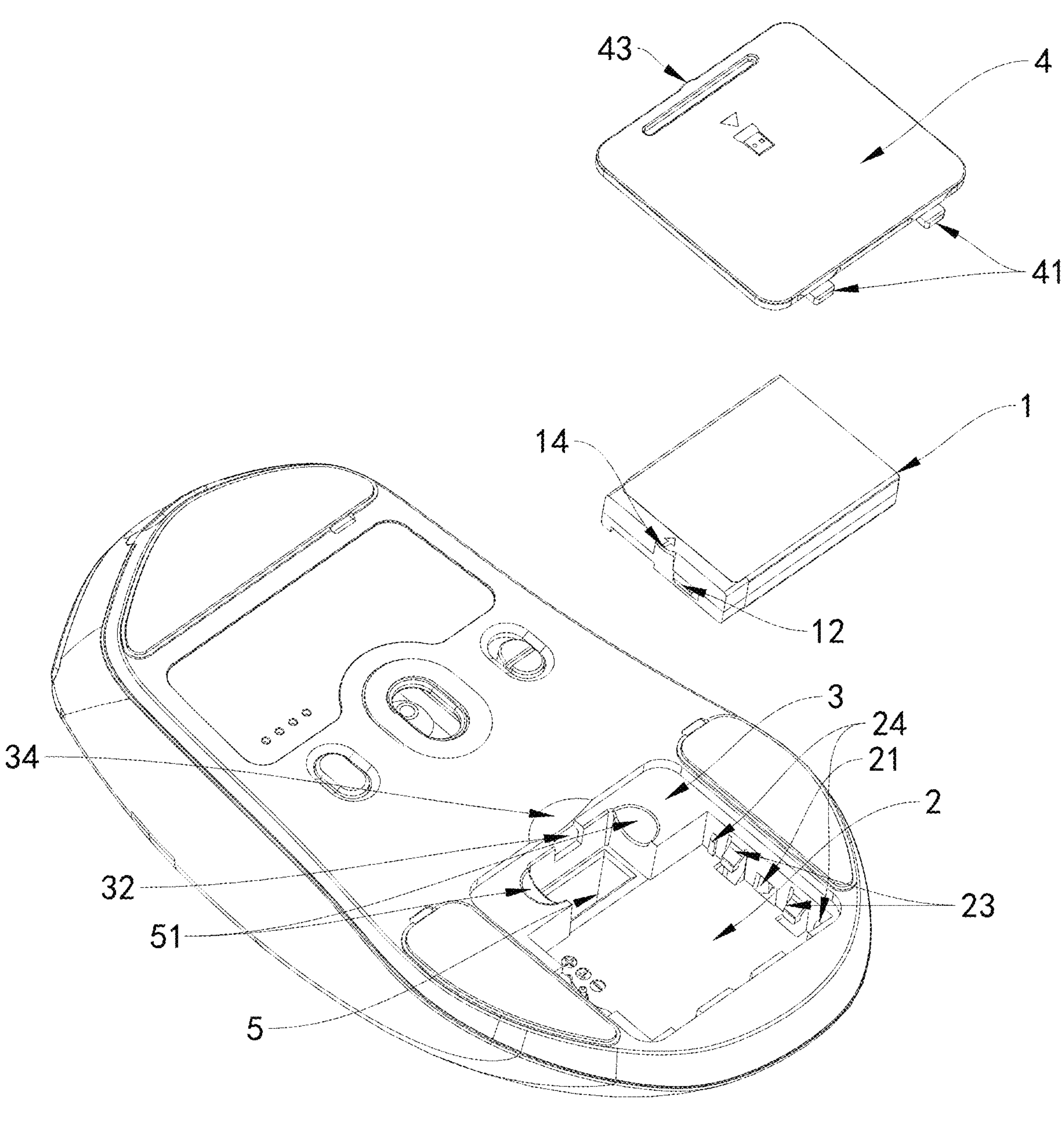
FIG. 2 is a structural schematic view of a battery compartment and a battery compartment outer cover groove of the present disclosure.
Figure 3:
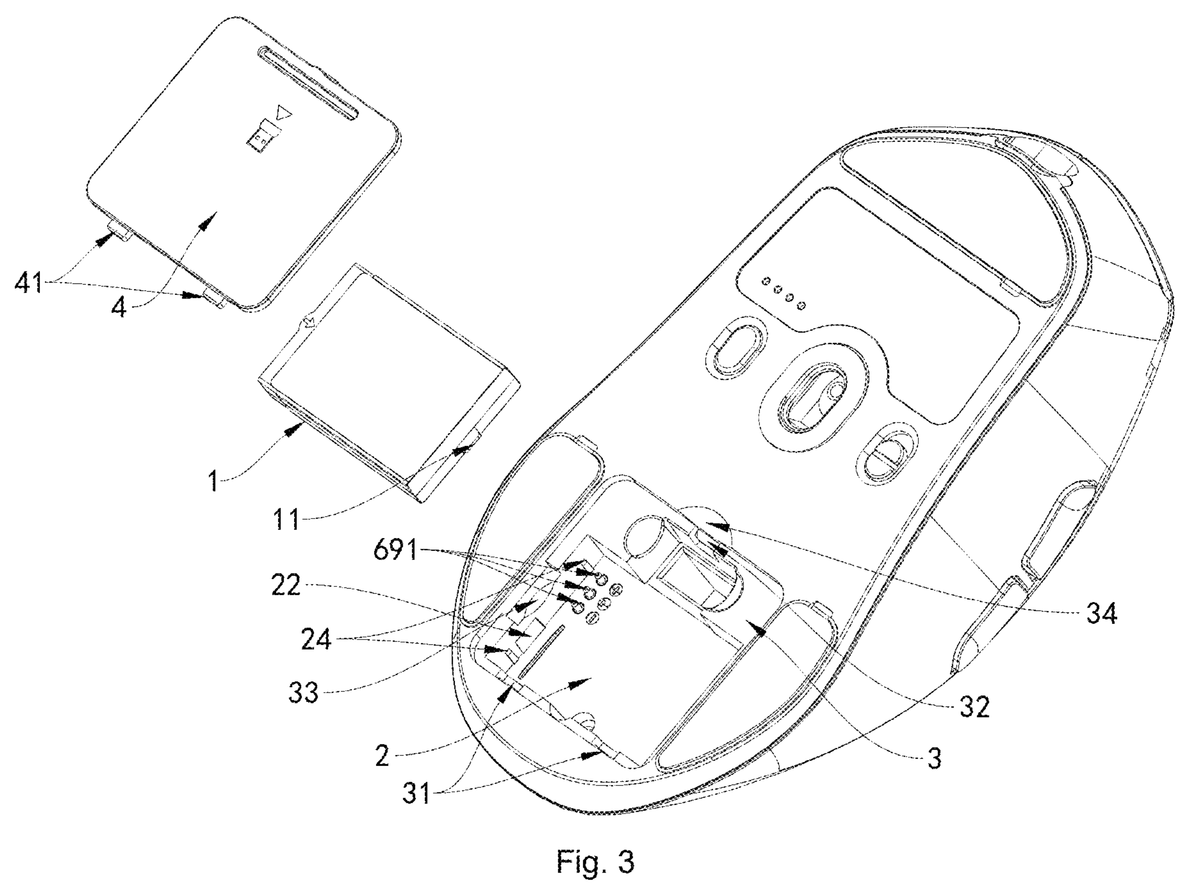
FIG. 3 is another structural schematic view of the battery compartment and the battery compartment outer cover groove of the present disclosure.
Figure 4:
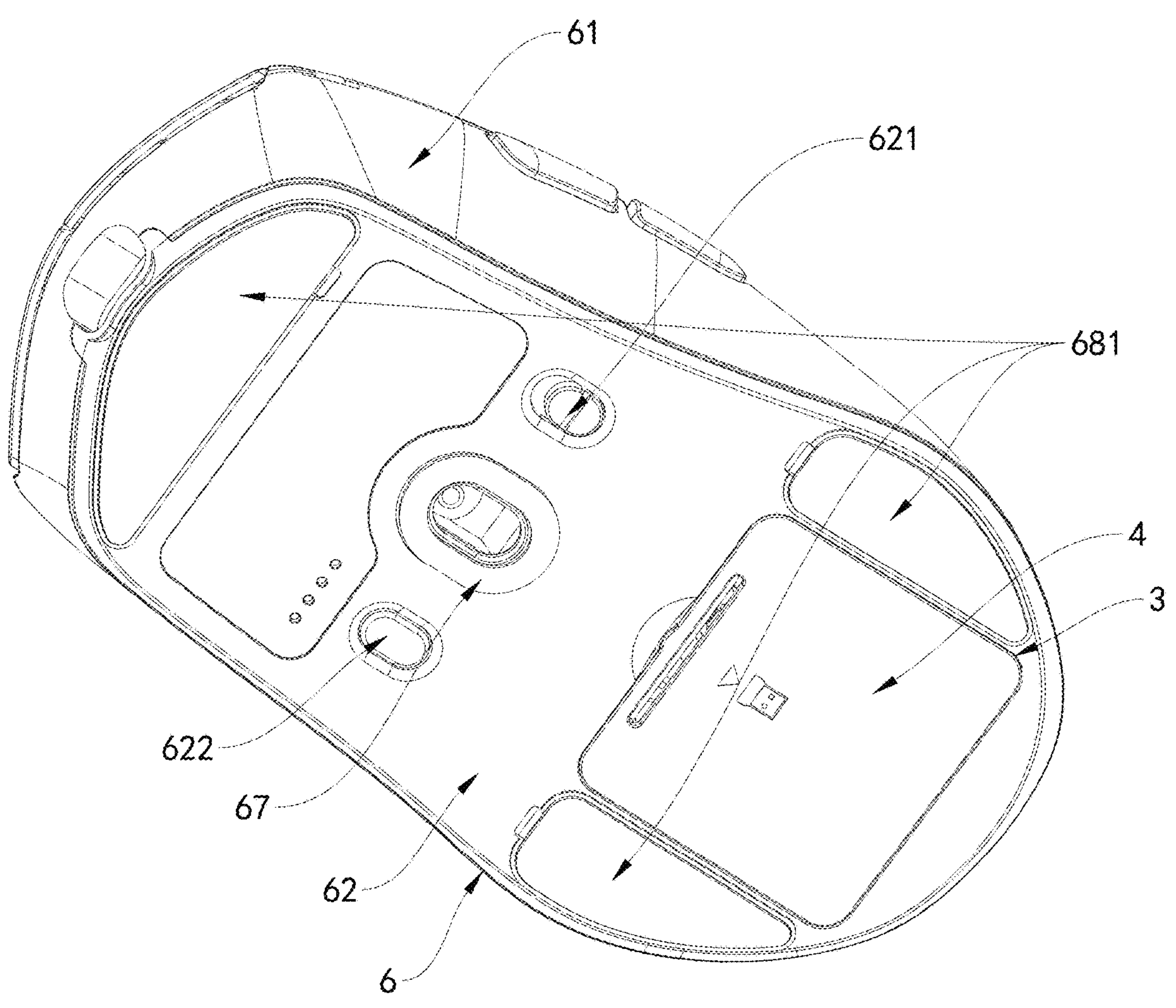
FIG. 4 is a structural schematic view of a battery compartment outer cover in a buckled state with the battery compartment outer cover groove of the present disclosure.
Figure 5:
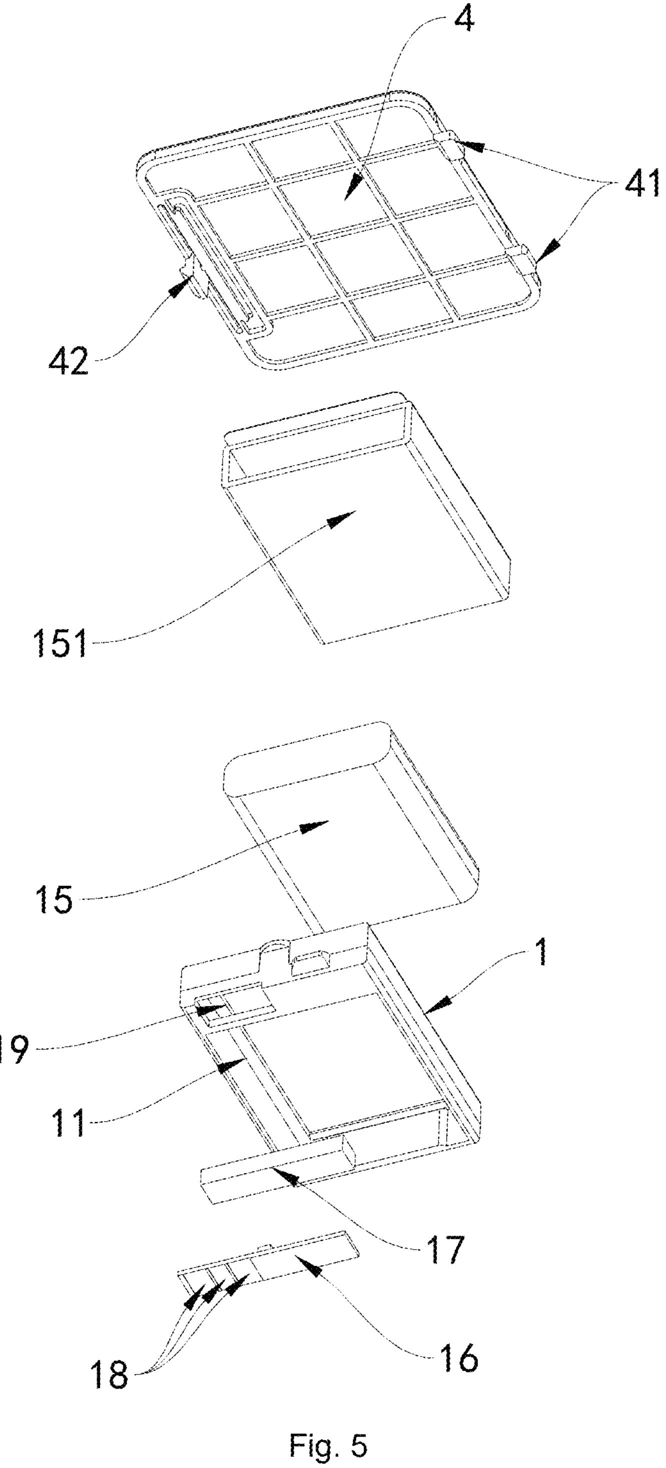
FIG. 5 is an exploded structural view of the battery pack of the present disclosure.
Figure 6:
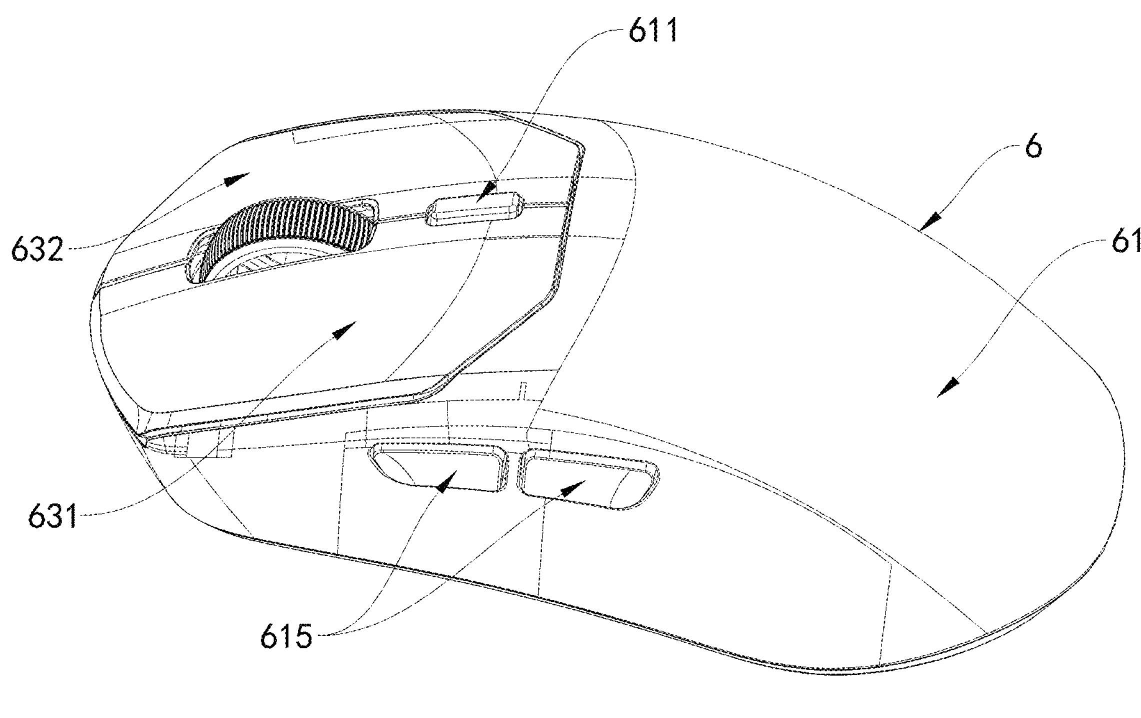
FIG. 6 is a structural schematic view of a mouse main body of the present disclosure.
Figure 7:
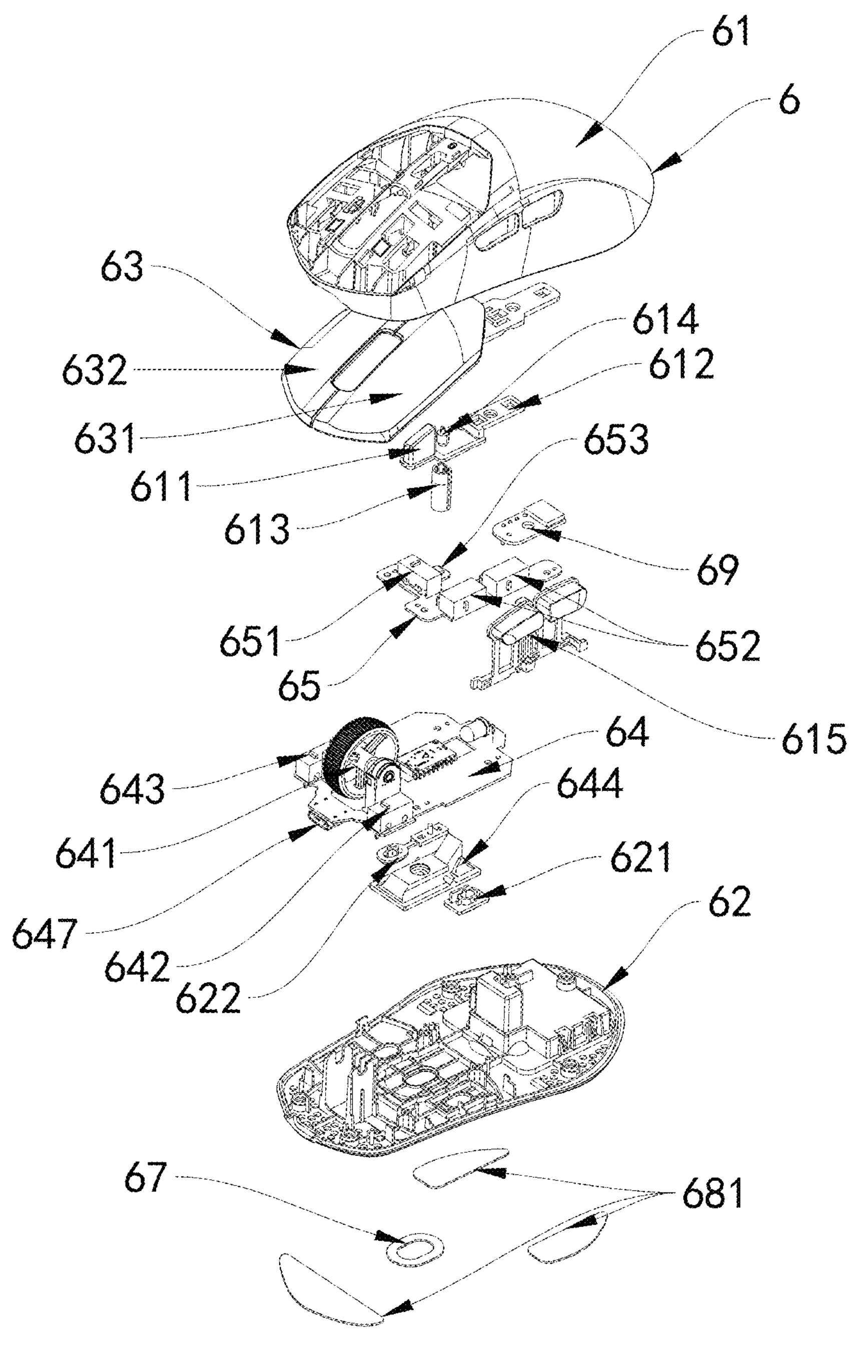
FIG. 7 is an exploded structural view of the mouse main body of the present disclosure.
Figure 8:
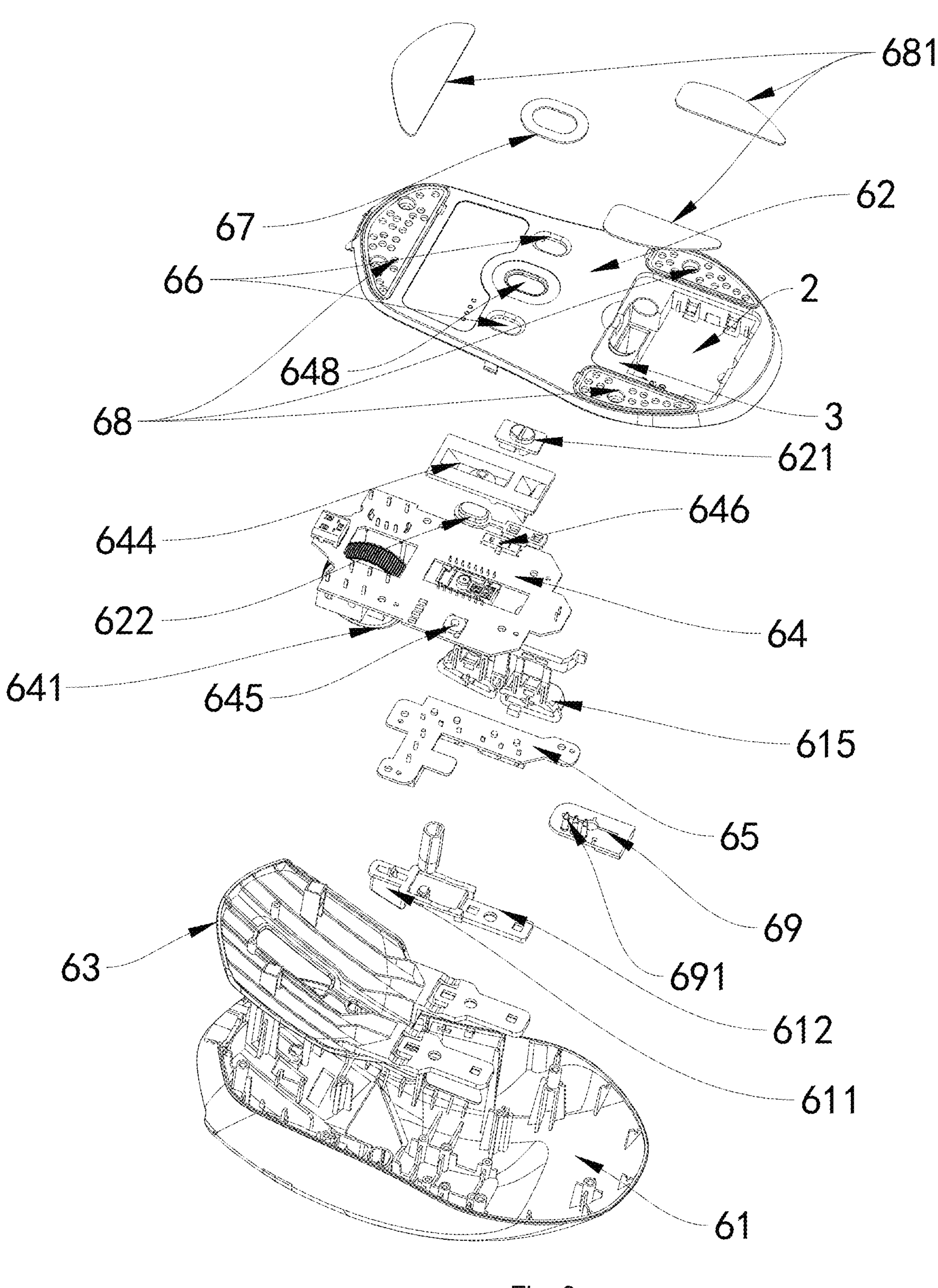
FIG. 8 is another exploded structural view of the mouse main body of the present disclosure.

As shown in FIGS. 1 to 8, an easily detachable mouse battery proposed in one embodiment of the present disclosure comprises:

a battery pack 1, a first positioning block 11 being disposed at one end of the battery pack 1, and a second positioning block 12 being disposed at the other end of the battery pack 1;

a battery compartment 2, a first positioning hole 21 mated with the first positioning block 11 and a second positioning hole 22 mated with the second positioning block 12 being formed on an inner wall of the battery compartment 2.

As shown in FIGS. 1 to 8, in some embodiments, at least one elastic arm 23 is disposed on a side wall of the battery compartment 2, the elastic arm 23 being located at one side of the first positioning hole 21 and extending toward an inner portion of the battery compartment 2.

At least one elastic arm 23 is additionally provided on the side wall of the battery compartment 2, the elastic arm 23 being located at one side of the first positioning hole 21 and extending toward the inner portion of the battery compartment 2. When the battery pack 1 is inserted into the battery compartment 2, the elastic arm 23 comes into contact with the housing 13 of the battery pack 1 and is compressed, thereby generating a continuous elastic abutting force. This structural design enables the battery pack 1 to be firmly pressed in the battery compartment 2 by the elastic arm 23 after mounting, effectively preventing the positioning blocks from disengagement or poor contact caused by shaking or vibration; meanwhile, when the battery pack 1 is disassembled, the elastic reset force of the elastic arm 23 can assist in pushing the battery pack 1 to move outward, so that the first positioning block 11 and the second positioning block 12 can be more easily separated from the corresponding positioning holes, thereby significantly improving the convenience of disassembly.

As shown in FIGS. 1 to 8, in some embodiments, a length of the first positioning block 11 is greater than that of the second positioning block 12; a first protrusion 14 is disposed at an end of the battery pack 1 corresponding to the second positioning block 12;

the first positioning hole 21 and the second positioning hole 22 are respectively formed on two opposite side walls of the battery compartment 2, guide ribs 24 are further disposed on the two opposite side walls of the battery compartment 2, and ends of the guide ribs 24 facing an opening of the battery compartment 2 are arcuately configured.

By setting the length of the first positioning block 11 to be greater than that of the second positioning block 12, sequential positioning during the mounting of the battery pack 1 is achieved: the longer first positioning block 11 is first snap-fitted into the first positioning hole 21, at which time the corresponding end of the battery pack 1 compresses the elastic arm 23 to make room for the shorter second positioning block 12, so that the second positioning block 12 can smoothly slide into the battery compartment 2 and be snap-fitted with the second positioning hole 22, and then the elastic arm 23 resets to push the battery pack 1 toward the side of the second positioning hole 22, ensuring stable snap-fit engagement between the second positioning block 12 and the second positioning hole 22; at the same time, the first protrusion 14 is disposed at the end of the battery pack 1 corresponding to the second positioning block 12, facilitating the user to pull up the battery pack 1 with fingers during disassembly. In addition, the first positioning hole 21 and the second positioning hole 22 are respectively formed on the two opposite side walls of the battery compartment 2, with the guide ribs 24 further disposed on the two side walls, and the ends of the guide ribs 24 facing the opening of the battery compartment 2 being arcuate. After the battery pack 1 is mounted in place, the guide ribs 24 form an auxiliary support with the two sides of the battery pack 1, effectively restricting left and right swinging or torsion of the battery pack 1 in the compartment, and ensuring stable snap-fit engagement of the first positioning block 11 and the second positioning block 12 with the positioning holes as well as reliable contact of the contact copper pin 691 with the conductive region 18; meanwhile, the guide ribs 24 convert the surface contact between the battery pack 1 and the side walls into line contact, greatly reducing the frictional resistance and making assembly and disassembly smoother, and the arcuate ends can avoid scratching the surface of the housing 13 of the battery pack 1, improving the user experience.

As shown in FIGS. 1 to 8, in some embodiments, the mouse battery further comprises a battery compartment outer cover groove 3 and a battery compartment outer cover 4, the battery compartment outer cover groove 3 being formed at the opening of the battery compartment 2, at least two positioning notches 31 and one clamping hole 32 being formed in the battery compartment outer cover groove 3, a positioning bump 41 mated with the positioning notches 31 and a buckle 42 mated with the clamping hole 32 being disposed on the battery compartment outer cover 4;

a battery pack disassembly opening 33 corresponding to a position of the first protrusion 14 is formed in the battery compartment outer cover groove 3;

an outer cover disassembly opening 34 is formed on a side wall of the battery compartment outer cover groove 3 opposite to the clamping hole 32, and a second protrusion 43 corresponding to the outer cover disassembly opening 34 is disposed on the battery compartment outer cover 4.

The battery compartment outer cover groove 3 is formed at the opening of the battery compartment 2, with the battery compartment outer cover 4 configured to cover the battery compartment outer cover groove 3; at least two positioning notches 31 and one clamping hole 32 are formed in the battery compartment outer cover groove 3, and the positioning bump 41 mated with the positioning notches 31 and the buckle 42 mated with the clamping hole 32 are correspondingly disposed on the battery compartment outer cover 4, thereby achieving multi-point fixation of the outer cover and ensuring that the outer cover is firmly covered and not prone to loosening. The battery pack disassembly opening 33 corresponding to the position of the first protrusion 14 on the battery pack 1 is further formed in the battery compartment outer cover groove 3, through which the user can directly touch the first protrusion 14 to facilitate pulling up the battery pack 1 for replacement. Meanwhile, the outer cover disassembly opening 34 is formed on the side wall of the battery compartment outer cover groove 3 opposite to the clamping hole 32, and the second protrusion 43 corresponding to the outer cover disassembly opening 34 is disposed on the battery compartment outer cover 4. The user only needs to pull the second protrusion 43 to disengage the buckle 42 from the clamping hole 32, so as to easily open the outer cover without any tools, which greatly improves the convenience of taking and placing the receiver and operating the battery pack 1.

As shown in FIGS. 1 to 8, in some embodiments, the battery pack 1 comprises a housing 13 and a battery cell 15 disposed in the housing 13, an outer side of the housing 13 being wrapped with a fixed wrapping sticker 151 for securing the battery cell 15 within the housing 13, a battery cell protection plate 16 located at one end of the battery cell 15 and a cell support cotton 17 located above the battery cell protection plate 16 being further disposed in the housing 13, a conductive region 18 being disposed on the battery cell protection plate 16, a butt joint hole 19 being formed at a bottom of the housing 13, and the conductive region 18 being exposed through the butt joint hole 19; a contact copper pin 691 is disposed in the battery compartment 2, and the contact copper pin 691 extends toward the inner portion of the battery compartment 2 for contacting the conductive region 18. The battery cell 15 is encapsulated in the housing 13, the battery cell protection plate 16 is disposed at one end of the battery cell, and the cell support cotton 17 is padded above the protection plate, which can absorb vibration and prevent the protection plate from being damaged due to impact; the conductive region 18 is integrated on the protection plate, the butt joint hole 19 is formed at the bottom of the housing 13, and the conductive region 18 is accurately exposed through the butt joint hole 19. The contact copper pin 691 is mounted at a corresponding position in the battery compartment 2, and the contact copper pin 691 extends toward the inner portion of the battery compartment 2. When the battery pack 1 is inserted, the conductive region 18 is in reliable contact with the contact copper pin 691 to form an electrical connection. This design concentrates the electrical interface of the battery pack 1 at the bottom and achieves precise positioning through the butt joint hole 19, ensuring the accuracy of the butt joint between the conductive region 18 and the contact copper pin 691; meanwhile, the support cotton provides buffer protection, prolonging the service life of the battery pack 1.

As shown in FIGS. 1 to 8, in some embodiments, the mouse battery further comprises a receiver compartment 5, the receiver compartment 5 being disposed at one side of the battery compartment 2, an opening of the receiver compartment 5 extending into the battery compartment outer cover groove 3, and receiver pick-and-place grooves 51 being formed on two sides of the opening of the receiver compartment 5.

The receiver compartment 5 is additionally provided, which is located at one side of the battery compartment 2, with its opening extending into the battery compartment outer cover groove 3, so that the receiver can be directly seen and touched after the battery compartment outer cover 4 is opened. The receiver pick-and-place grooves 51 are formed on two sides of the opening of the receiver compartment 5, and the concave space of the pick-and-place grooves facilitates the user to pinch two sides of the receiver with fingers to easily take out or insert the receiver, avoiding the problem that the receiver is difficult to take due to its small size. This integrated layout not only saves the internal space of the mouse, but also makes the storage and taking of the wireless receiver extremely convenient without turning over the mouse or finding an additional storage position.

A mouse, comprising a mouse main body 6 and the aforementioned easily detachable mouse battery, the mouse main body 6 comprising a mouse upper cover 61 and a mouse lower cover 62 connected in a covering manner;

- a key operating mechanism 63 is assembled on the mouse upper cover 61;
- a main circuit board 64 is mounted on a top of the mouse lower cover 62, a roller module 641, a left key switch 642 and a right key switch 643 respectively located on two sides of the roller module 641 being integrated on the main circuit board 64;
- the battery compartment 2, the battery compartment outer cover groove 3 and the receiver compartment 5 are all integrally formed at a bottom of the mouse lower cover 62.

The key operating mechanism 63 is assembled on the mouse upper cover 61 for implementing click instructions; the main circuit board 64 is mounted on the top of the mouse lower cover 62, and the main circuit board 64 carries the roller module 641 and the left key switch 642 and the right key switch 643 respectively located on two sides of the roller module 641, forming core control components of the mouse; the battery compartment 2, the battery compartment outer cover groove 3 and the receiver compartment 5 are all integrally formed at the bottom of the mouse lower cover 62. This layout integrates the structures related to the battery and the receiver at the bottom of the lower cover and isolates them from the internal circuit part of the mouse, which is not only compact in structure, but also eliminates the need to disassemble the mouse upper cover 61 when replacing the battery or taking and placing the receiver, avoiding interference with internal precision components; meanwhile, integral forming ensures the dimensional accuracy and structural strength of each compartment.

As shown in FIGS. 1 to 8, in some embodiments, the key operating mechanism 63 comprises a left key pressing member 631 and a right key pressing member 632, and one ends of the left key pressing member 631 and the right key pressing member 632 are respectively movably connected with an inner wall of the mouse upper cover 61 to form a lever structure, facilitating the user to press and trigger, and the other ends are respectively corresponding to the left key switch 642 and the right key switch 643;

- a secondary circuit board 65 is fixed in an inner cavity of the mouse upper cover 61, a DPI adjustment switch 651, two side key switches 652 and an indicator light 653 being integrated on the secondary circuit board 65 to centralize the control of auxiliary functions;
- a DPI adjustment button 611 is further disposed in the inner cavity of the mouse upper cover 61, the DPI adjustment button 611 being mounted in the upper cover via a mounting bracket 612 integrally formed therewith, and the mounting bracket 612 providing stable support to achieve precise positioning of the DPI adjustment button 611; a pressing end of the DPI adjustment button 611 corresponds to the DPI adjustment switch 651, and an operating end of the DPI adjustment button 611 passes through the mouse upper cover 61 and is exposed between the left key pressing member 631 and the right key pressing member 632, so that the user can easily touch the DPI adjustment button with the middle finger or index finger when holding the mouse to realize DPI gear switching, with smooth operation without moving the fingers.

As shown in FIGS. 1 to 8, in some embodiments, a light shield 613 is further disposed in the inner cavity of the mouse upper cover 61, a bottom of the light shield 613 closely covering an outer side of the indicator light 653 to prevent light scattering from causing interference; a light guide member 614 is connected to a top of the light shield 613, and one end of the light guide member 614 extends to the side of the DPI adjustment button 611 to guide the light of the indicator light 653 to the area near the DPI adjustment button 611, making the light state clearly visible and improving the user experience. Meanwhile, two side key pressing members 615 are disposed at positions in the inner cavity of the mouse upper cover 61 corresponding to the side key switches 652, and one ends of the side key pressing members 615 extend to an outer side of a side wall of the mouse upper cover 61, so that the user's thumb can naturally touch the side key pressing members, facilitating triggering of the side key function; in addition, the side key pressing members 615 have a simple structure and direct transmission, ensuring a comfortable pressing feel.

As shown in FIGS. 1 to 8, in some embodiments, a top of the roller module 641 passes through the mouse upper cover 61 and is exposed between the left key pressing member 631 and the right key pressing member 632, conforming to conventional mouse operating habits;

an optical sensing lens 644, a pairing key 645 and a power switch 646 respectively located on two sides of the optical sensing lens 644 are integrated on a bottom of the main circuit board 64, and the optical sensing lens 644 is used for detecting the movement of the mouse;

a switch knob 621 corresponding to the power switch 646 and a pairing button 622 corresponding to the pairing key 645 are further disposed on the top of the mouse lower cover 62, and the switch knob 621 and the pairing button 622 are respectively exposed on the surface through through holes 66 formed on the mouse lower cover 62, enabling the user to perform on-off or pairing operations without disassembling the mouse and thus greatly improving the convenience of use;

a charging interface 647 is further connected to the bottom of the main circuit board 64, and one end of the charging interface 647 extends to an outer side of an end portion of the mouse upper cover 61 to facilitate connection with a charging cable;

a light-transmitting window 648 for exposing the optical sensing lens 644 is formed at the bottom of the mouse lower cover 62 to ensure the normal operation of the sensor; a main anti-slip pad 67 is annularly disposed on the periphery of the light-transmitting window 648 to enhance the grip of the mouse on the desktop;

a plurality of hollowed-out areas 68 are further distributed at the bottom of the mouse lower cover 62, an auxiliary anti-slip pad 681 being embedded in each of the hollowed-out areas 68 to further optimize the anti-slip effect, and the hollowed-out design can reduce the weight of the mouse;

an auxiliary circuit board 69 is further fixed on a top surface of the mouse lower cover 62, and the contact copper pin 691 is mounted on the auxiliary circuit board 69, so that the battery contact points are independently arranged to facilitate maintenance and replacement, and avoid damage to the main circuit board 64 caused by frequent plugging and unplugging of the battery. The main PCB of the mouse serves as a core control board, the top of which is integrated with the roller module 641, the left key switch 642 and the right key switch 643, and the bottom of which is integrated with the optical sensing lens 644, the pairing key 645 and the power switch 646.

The main PCB is electrically connected with the secondary circuit board 65 mounted in the inner cavity of the mouse upper cover 61 via a flexible circuit board to realize signal transmission of the DPI adjustment switch 651, the side key switches 652 and the indicator light 653; meanwhile, the main PCB of the mouse is electrically connected with the auxiliary circuit board 69 fixed on the top surface of the mouse lower cover 62 via a wire or a flexible circuit board, the auxiliary circuit board 69 being provided with the contact copper pin 691 for supplying power to the battery pack 1, and the auxiliary circuit board 69 is also connected to the switch knob 621 and the pairing button 622 via wires to realize signal transmission for power control and pairing operations; in addition, the charging interface 647 connected to the bottom of the main PCB is connected to an external power source via a wire to provide a charging path for the battery pack 1. The electrical connections between the various circuit boards are all fixed in a pluggable or welded manner, ensuring stable and reliable signal transmission and facilitating assembly and maintenance.

Embodiment 2

Figure 9:
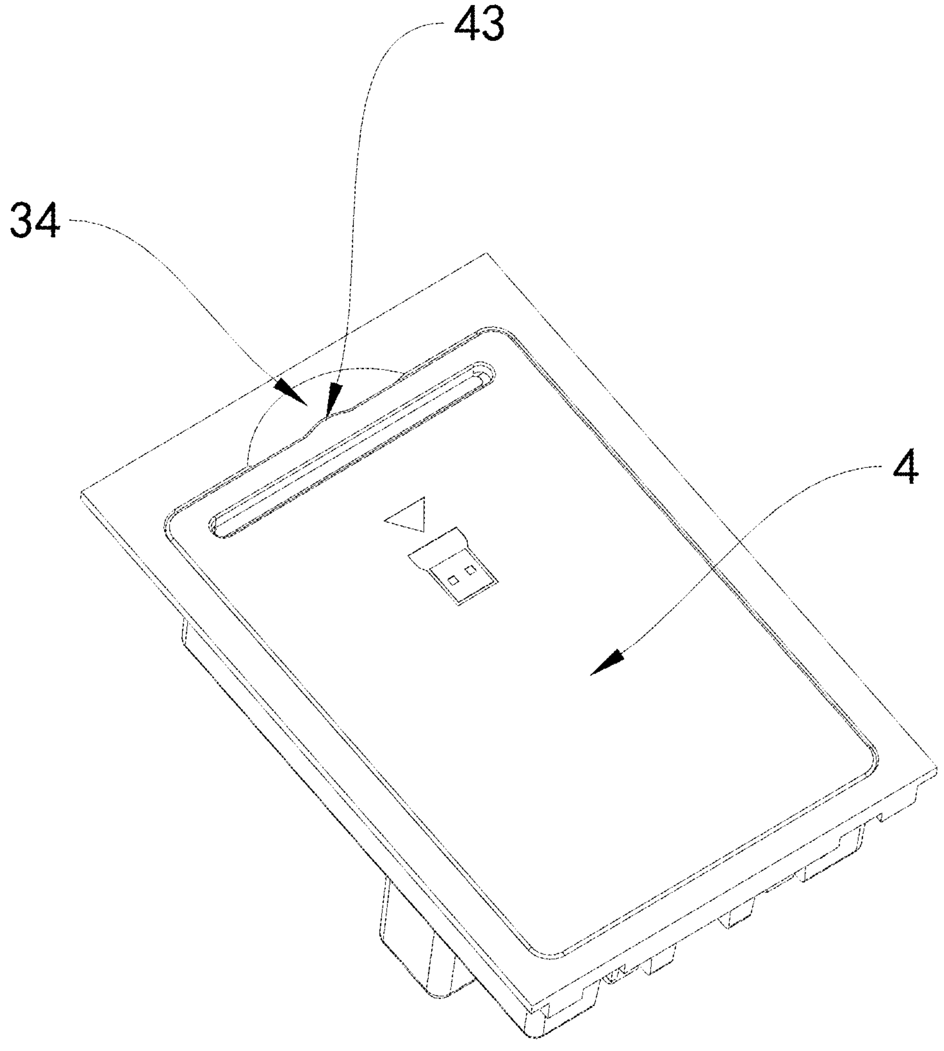
FIG. 9 is a structural schematic view of Embodiment 2 of the present disclosure.
Figure 10:
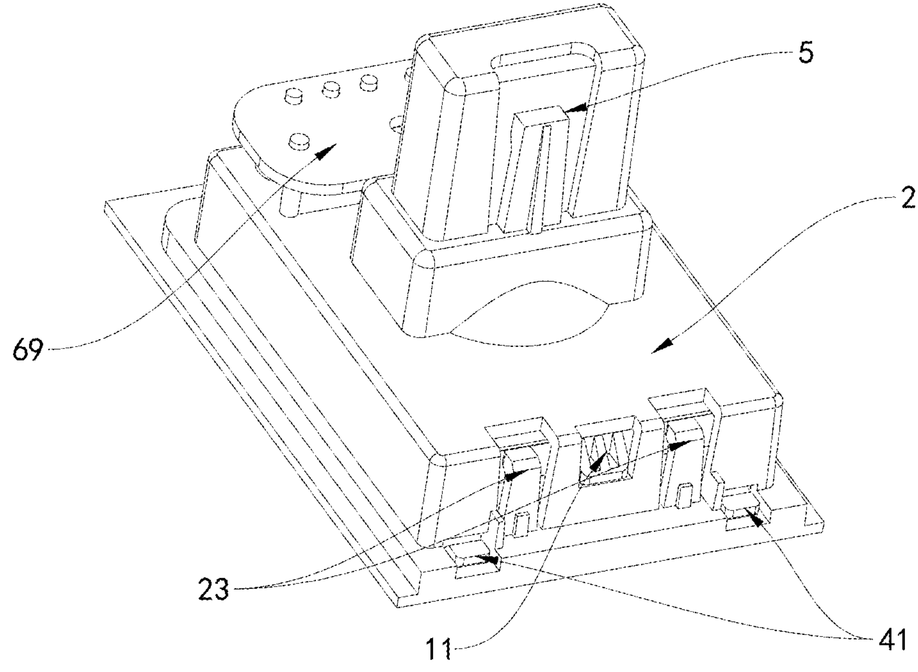
FIG. 10 is another structural schematic view of Embodiment 2 of the present disclosure.
Figure 11:
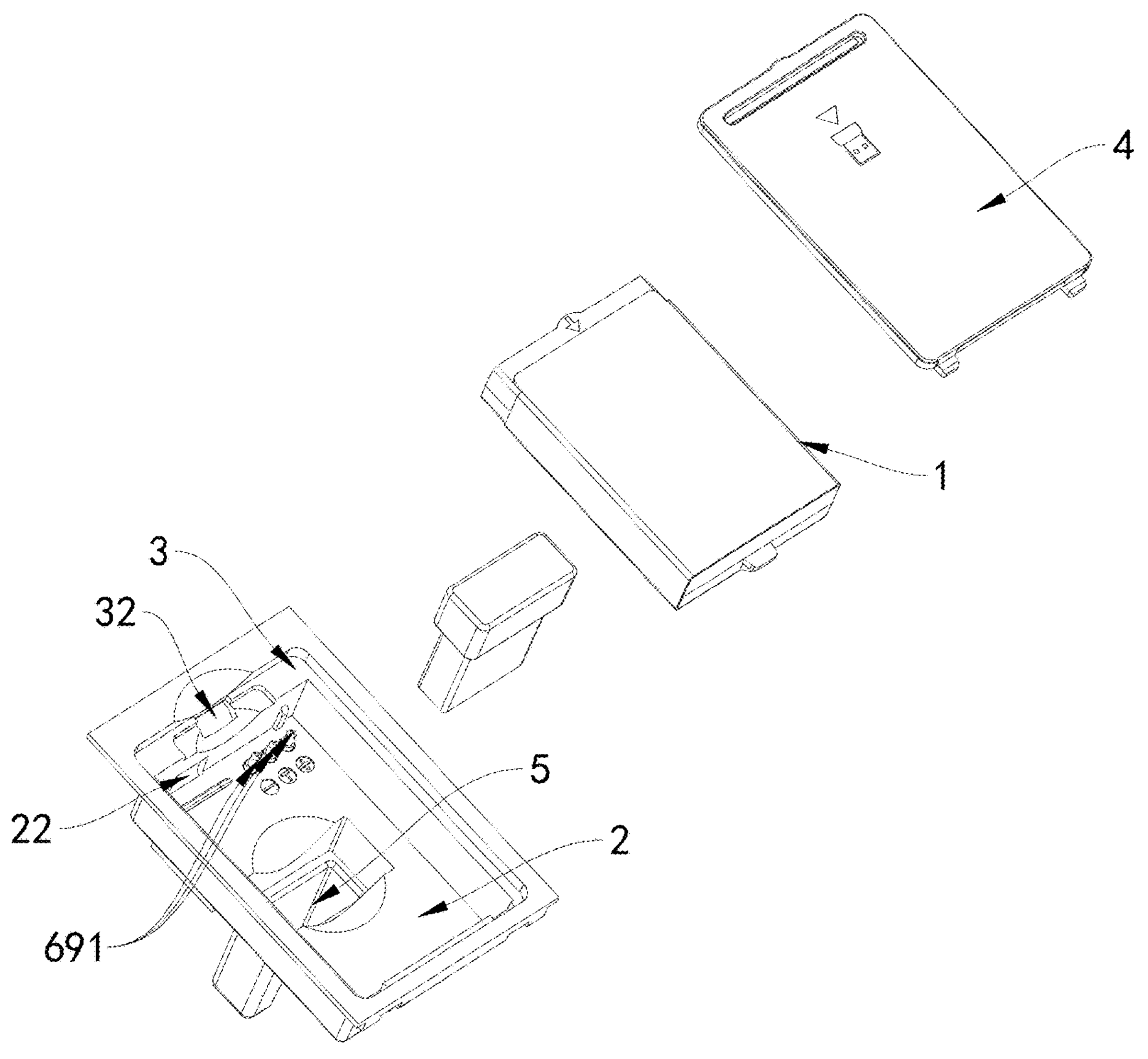
FIG. 11 is an exploded structural view of Embodiment 2 of the present disclosure.

As shown in FIGS. 1 to 11, in another embodiment, the receiver compartment 5 is disposed at a middle position inside the battery compartment 2. Specifically, the receiver compartment 5 is located at the bottom of the battery compartment 2, with its opening facing the inner portion of the battery compartment 2. When the battery pack 1 is not inserted, the receiver compartment 5 is completely exposed in the battery compartment 2; when the battery pack 1 is inserted, the battery pack 1 covers the receiver compartment 5. Receiver pick-and-place grooves 51 are still formed on two sides of the opening of the receiver compartment 5, facilitating pinching the receiver with fingers. In this embodiment, the battery pack 1 needs to be disassembled when taking the receiver; however, the receiver compartment 5 and the battery compartment 2 share the same space, making the overall layout of the bottom of the mouse more compact and further saving the internal space of the mouse.

Embodiment 3

Figure 12:
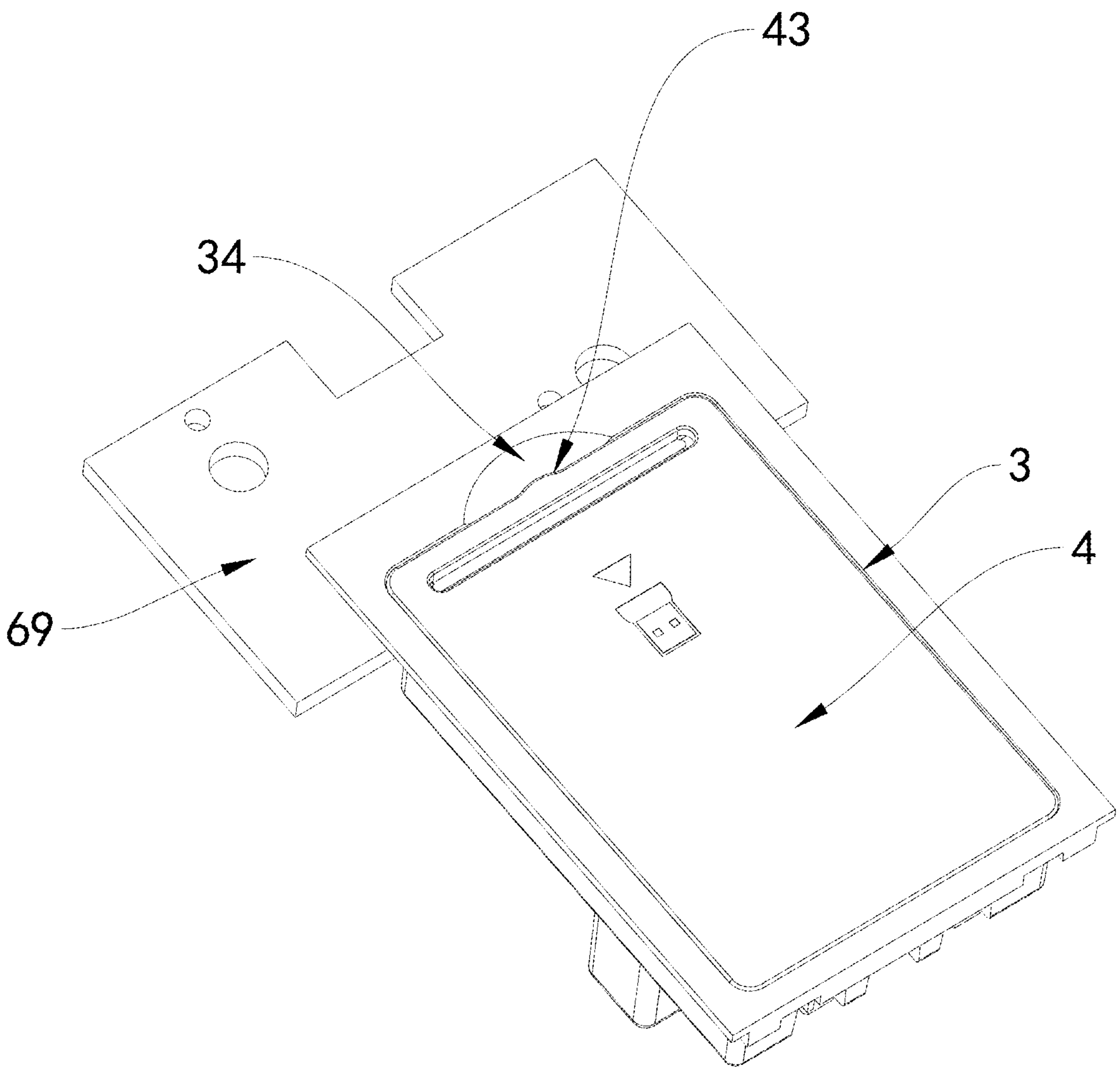
FIG. 12 is a structural schematic view of Embodiment 3 of the present disclosure.
Figure 13:
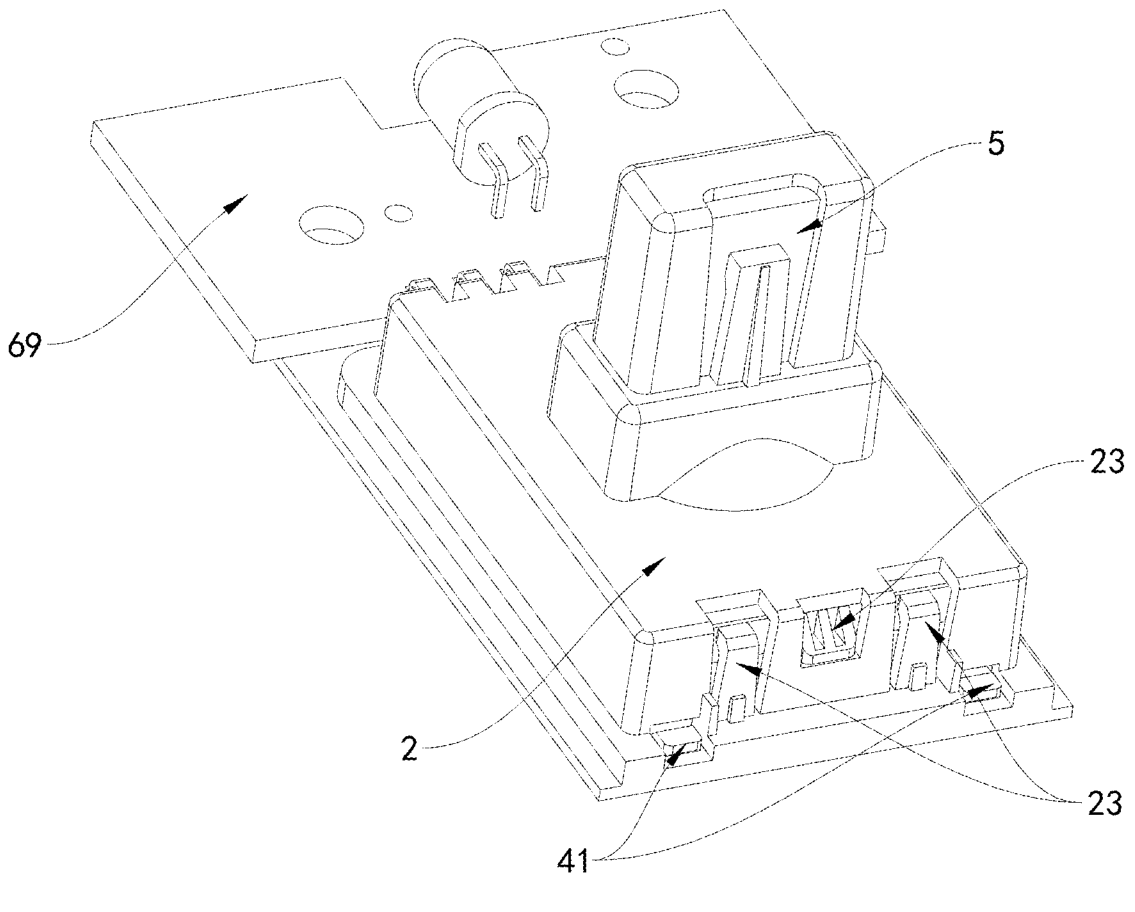
FIG. 13 is another structural schematic view of Embodiment 3 of the present disclosure.
Figure 14:
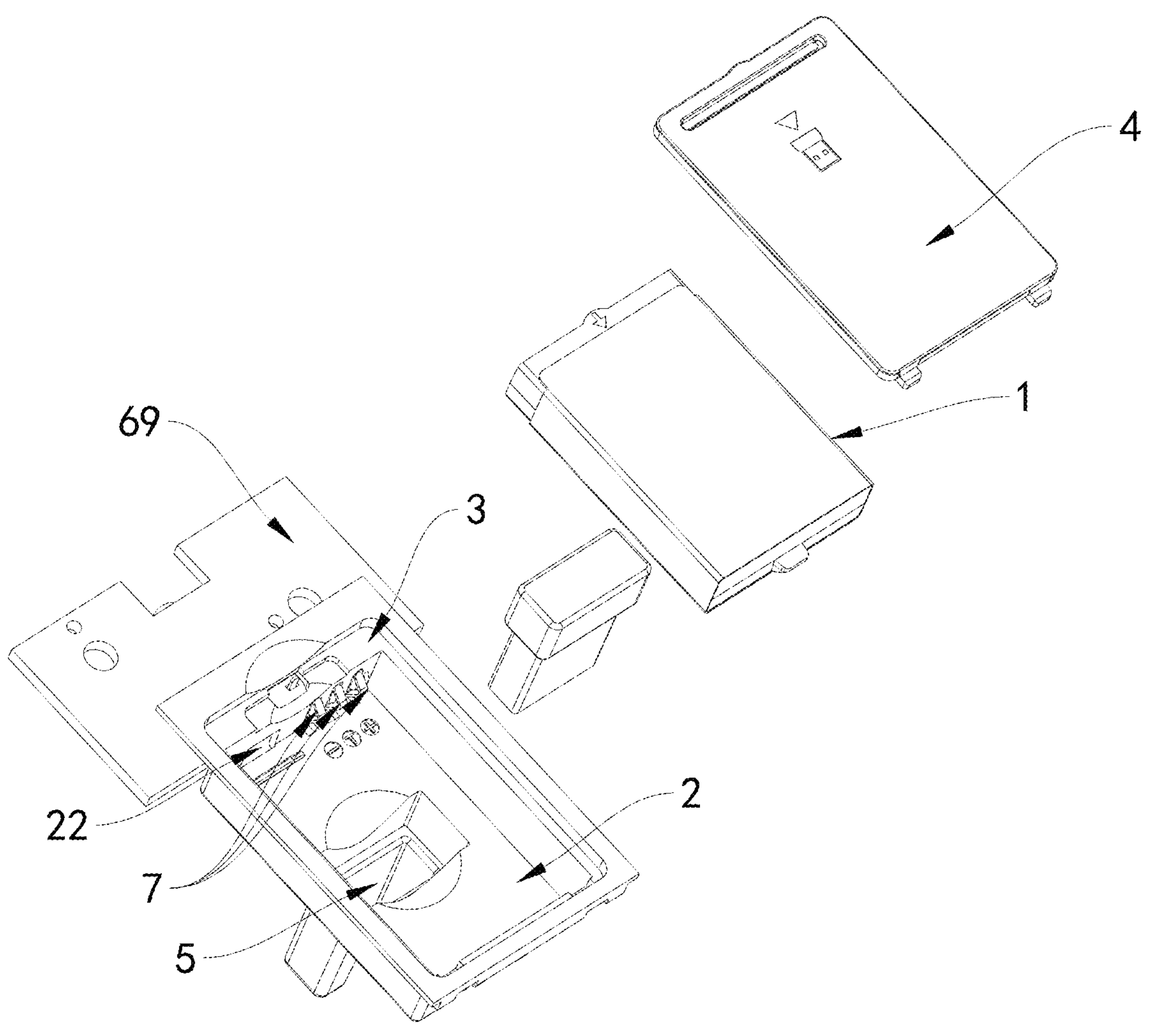
FIG. 14 is an exploded structural view of Embodiment 3 of the present disclosure.
Figure 15:
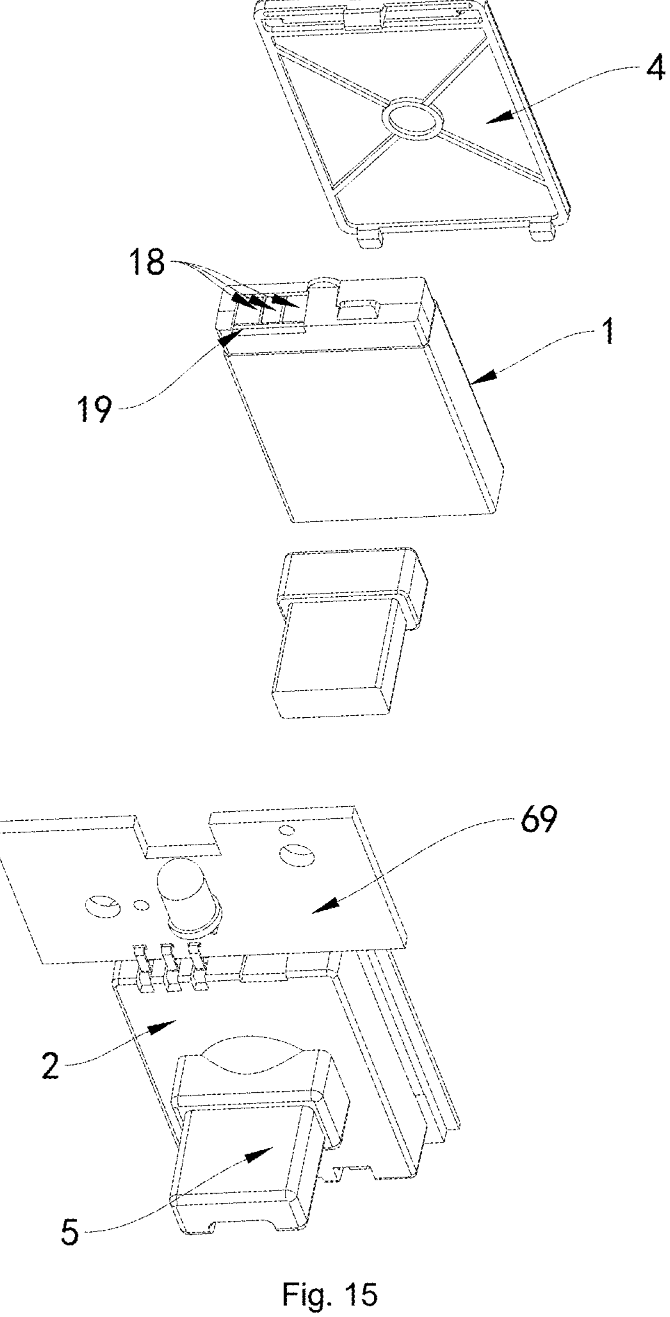
FIG. 15 is another exploded structural view of Embodiment 3 of the present disclosure.

As shown in FIGS. 1 to 15, in a further embodiment, based on the structure of Embodiment 2, the contact copper pin 691 is replaced with an elastic sheet. Specifically, conductive elastic sheets 7 are disposed on two opposite side walls of the battery compartment 2, one end of each conductive elastic sheet 7 is fixed on the side wall of the battery compartment 2, and the other end of each conductive elastic sheet 7 is bent and extended toward the inner portion of the battery compartment 2 to form an elastic contact portion. Correspondingly, the battery cell protection plate 16 inside the battery pack 1 is disposed at one end of the battery cell 15, and the conductive region 18 thereof is disposed toward an end portion of the housing 13 of the battery pack 1. When the battery pack 1 is inserted into the battery compartment 2, the elastic contact portion of the conductive elastic sheet 7 elastically abuts against the conductive region 18 at the end portion of the battery pack 1 to form an electrical connection. In this embodiment, the copper pin is replaced with the elastic sheet, and the elastic deformation of the elastic sheet is used to compensate for assembly tolerances, ensuring contact reliability; meanwhile, this design provides greater design flexibility for the internal layout of the battery pack 1.

In summary, the battery pack 1 achieves sequential snap-fit engagement via the longer first positioning block 11 at one end and the second positioning block 12 at the other end, which mate with the first positioning hole 21 and the second positioning hole 22 in the battery compartment 2, and the elastic abutting force of the elastic arm 23 is combined to ensure stable mounting and easy disassembly; the guide ribs 24 disposed on the two opposite side walls of the battery compartment 2 form an auxiliary support after the battery pack 1 is mounted in place, effectively restricting left and right swinging and torsion of the battery pack 1, ensuring stable snap-fit engagement of the first positioning block 11 and the second positioning block 12 with the positioning holes as well as reliable contact of the contact copper pin 691 with the conductive region 18; meanwhile, the guide ribs 24 convert surface contact into line contact to reduce frictional resistance, and their arcuate ends can avoid scratching the surface of the housing 13 of the battery pack 1; the battery compartment outer cover groove 3 is formed at the opening of the battery compartment 2, the positioning notches 31 and the clamping hole 32 in the battery compartment outer cover groove 3 are mated with the positioning bump 41 and the buckle 42 on the battery compartment outer cover 4 to achieve multi-point fixation of the outer cover; the battery pack disassembly opening 33 corresponding to the position of the first protrusion 14 and the outer cover disassembly opening 34 on the side wall opposite to the clamping hole 32 are further formed in the battery compartment outer cover groove 3, and mated with the second protrusion 43 on the battery compartment outer cover 4, enabling the user to easily open the outer cover and pull up the battery pack 1 for replacement without any tools; the receiver compartment 5 is disposed at one side of the battery compartment 2, with its opening extending into the battery compartment outer cover groove 3, and receiver pick-and-place grooves 51 formed on two sides of the opening for facilitating the pick-and-place of the receiver. The overall structure is compact, which significantly improves the convenience of assembling and disassembling the battery pack 1 and the receiver as well as the stability in use.

Finally, it should be noted that the above embodiments are only preferred embodiments of the present disclosure and are not intended to limit the present disclosure. Although the present disclosure has been described in detail with reference to the foregoing embodiments, those skilled in the art may still modify the technical solutions described in the foregoing embodiments or equivalently replace some of the technical features thereof. Any modification, equivalent replacement, improvement or the like made within the spirit and principle of the present disclosure shall all be included within the protection scope of the present disclosure.

The invention claimed is:

1. An easily detachable mouse battery, comprising:

a battery pack (1), a first positioning block (11) arranged at one end of the battery pack (1), and a second positioning block (12) arranged at the other end of the battery pack (1) wherein the battery pack (1) comprises a housing (13), a battery cell (15) arranged in the housing (13), the outside of the housing (13) being wrapped with a fixed wrapping sticker (151) for fixing the battery cell (15) in the housing (13), a battery cell protection plate (16) located at one end of the battery cell (15), and a cell support cotton (17) located above the battery cell protection plate (16) and arranged in the housing (13), a butt joint hole (19) formed at a bottom of the housing (13), and a conductive region (18) arranged on the battery cell protection plate (16) and exposed through the butt joint hole (19);

a battery compartment (2), a first positioning hole (21) matched with the first positioning block (11), and a second positioning hole (22) matched with the second positioning block (12) and formed on an inner wall of the battery compartment (2); and a contact copper pin (691) arranged in the battery compartment (2) and contacted the conductive region (18).

2. A mouse comprising the easily detachable mouse battery of claim 1 and a mouse main body (6) comprising:

a mouse upper cover (61) and a mouse lower cover (62) which are connected in a covering manner;

a key operating mechanism (63) assembled on the mouse upper cover (61);

a main circuit board (64) mounted on a top of the mouse lower cover (62), the main circuit board (64) comprising a roller module (641), a left key switch (642) located at one side of the roller module (641), and a right key switch (643) located at the other side of the roller module (641) wherein the left key switch (642) and the right key switch (643) are integrally formed on the main circuit board (64), and a top of the roller module (641) passes through the mouse upper cover (61) and is exposed between the left key pressing member (631) and the right key pressing member (632);

an optical sensing lens (644), a pairing key (645) located at one side of the optical sensing lens (644), and a power switch (646) located at the other side of the optical sensing lens (644) wherein the pairing key (645) and the power switch (646) are integrally formed on a bottom of the main circuit board (64);

a switch knob (621) corresponding to the power switch (646) and arranged on the top of the mouse lower cover (62);

a pairing button (622) corresponding to the pairing key (645) and arranged on the top of the mouse lower cover (62) wherein the switch knob (621) and the pairing button (622) are respectively exposed through a plurality of through holes (66) formed on the mouse lower cover (62);

a charging interface (647) connected to the bottom of the main circuit board (64), the charging interface (647) having one end extending out of an end of the mouse upper cover (61);

a light-transmitting window (648) configured to expose the optical sensing lens (644) and formed at a bottom of the mouse lower cover (62); and an annular main anti-slip pad (67) located externally of the light-transmitting window (648) and arranged at the bottom of the mouse lower cover (62);

wherein the battery compartment (2), the battery compartment outer cover groove (3), and the receiver compartment (5) are integrally formed at the bottom of the mouse lower cover (62).

3. The mouse of claim 2, further comprising a plurality of hollowed-out areas (68) distributed at the bottom of the mouse lower cover (62), an auxiliary anti-slip pad (681) embedded in each of the hollowed-out areas (68), an auxiliary circuit board (69) fixed on the top of the mouse lower cover (62), and a contact copper pin (691) mounted on the auxiliary circuit board (69).

* * * * *